United States Patent
Hogaboam et al.

(10) Patent No.: US 11,513,552 B2
(45) Date of Patent: Nov. 29, 2022

(54) APPARATUS AND METHOD FOR DYNAMICALLY ADJUSTING QUANTUM COMPUTER CLOCK FREQUENCY WITH A LOCKING PULSE

(71) Applicant: Intel Corporation, Santa Clara, CA (US)

(72) Inventors: Justin Hogaboam, Aloha, OR (US); Sonika Johri, Portland, OR (US); Anne Matsuura, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 828 days.

(21) Appl. No.: 16/231,100

(22) Filed: Dec. 21, 2018

(65) Prior Publication Data

US 2020/0201379 A1     Jun. 25, 2020

(51) Int. Cl.
| | |
|---|---|
| *G06N 10/00* | (2022.01) |
| *G06F 1/06* | (2006.01) |
| *B82Y 10/00* | (2011.01) |
| *G01R 33/12* | (2006.01) |
| *G01R 33/09* | (2006.01) |
| *G06N 10/70* | (2022.01) |

(52) U.S. Cl.
CPC ............... *G06F 1/06* (2013.01); *B82Y 10/00* (2013.01); *G01R 33/093* (2013.01); *G01R 33/1284* (2013.01); *G06N 10/00* (2019.01); *G06N 10/70* (2022.01)

(58) Field of Classification Search
CPC .. G06F 1/06; G06F 1/08; B82Y 10/00; G01R 33/093; G01R 33/1284; G06N 10/00; G06N 10/70
See application file for complete search history.

(56) References Cited

U.S. PATENT DOCUMENTS

2014/0314419 A1† 10/2014 Paik
2014/0368234 A1† 12/2014 Chow et al.
(Continued)

FOREIGN PATENT DOCUMENTS

WO     2019168544     † 9/2019

OTHER PUBLICATIONS

Khodjasteh, Kaveh and Lorenza Viola, Dynamical quantum error correction of unitary operations with bounded controls, Physical Review A 803 (2009).†

*Primary Examiner* — Jung Kim

(74) *Attorney, Agent, or Firm* — Nicholson De Vos Webster & Elliott LLP

(57) ABSTRACT

Apparatus and method for dynamically adjusting a quantum computer clock frequency. For example, one embodiment of an apparatus comprises: a quantum execution unit to execute quantum operations specified by a quantum runtime; a qubit drive controller to translate the quantum operations into physical pulses directed to qubits on a quantum chip at a first cycle frequency; a spin echo sequencer to issue spin echo command sequences to cause the qubit drive controller to generate a sequence of spin echo pulses at the first cycle frequency; and qubit measurement circuitry to measure the qubits and to store qubit timing data for each qubit, the qubit timing data indicating a coherence time or an amount of computational time available for each qubit to perform quantum operations.

18 Claims, 12 Drawing Sheets

(56) References Cited

U.S. PATENT DOCUMENTS

2018/0330265 A1† 11/2018 Kelly
2019/0042973 A1* 2/2019 Zou .................... G06F 9/30101
2020/0143281 A1† 5/2020 Barends

* cited by examiner
† cited by third party

APPARATUS AND METHOD FOR DYNAMICALLY ADJUSTING QUANTUM COMPUTER CLOCK FREQUENCY WITH A LOCKING PULSE

BACKGROUND

Field of the Invention

The embodiments of the invention relate generally to the field of quantum computing. More particularly, these embodiments relate to an apparatus and method for dynamically adjusting a quantum computer clock frequency with a locking pulse.

Description of the Related Art

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Modern microprocessors have a natural operating frequency and voltage that determines the number of clock cycles available for computation. For each clock cycle, the classical computer system is able to perform various compute instructions at each clock cycle edge leading to a simplified indicator of the performance of a given CPU. In recent times and especially since the advent of mobile and tablet based processors, the frequency of the CPU can be adjusted to target lower power compute workloads or to reduce the power consumption or thermal emissions when in idle.

Current quantum computer design proposals, fix the clock frequency to the slowest quantum gate operation on the worst qubit in the system to ensure that all qubits are usable and with the lowest error rates. Unfortunately, this leaves a lot of performance on the table and also does not allow us to adjust the clock frequency to slower rates when the system begins to degrade due to environmental impact on our operational qubits. Once the quantum computer falls out of the fixed operational regime it must then be recalibrated and reset into a more favorable operable regime which can take hours to days each time that it happens.

BRIEF DESCRIPTION OF THE DRAWINGS

A better understanding of the present invention can be obtained from the following detailed description in conjunction with the following drawings, in which.

DETAILED DESCRIPTION

Figure 1A:
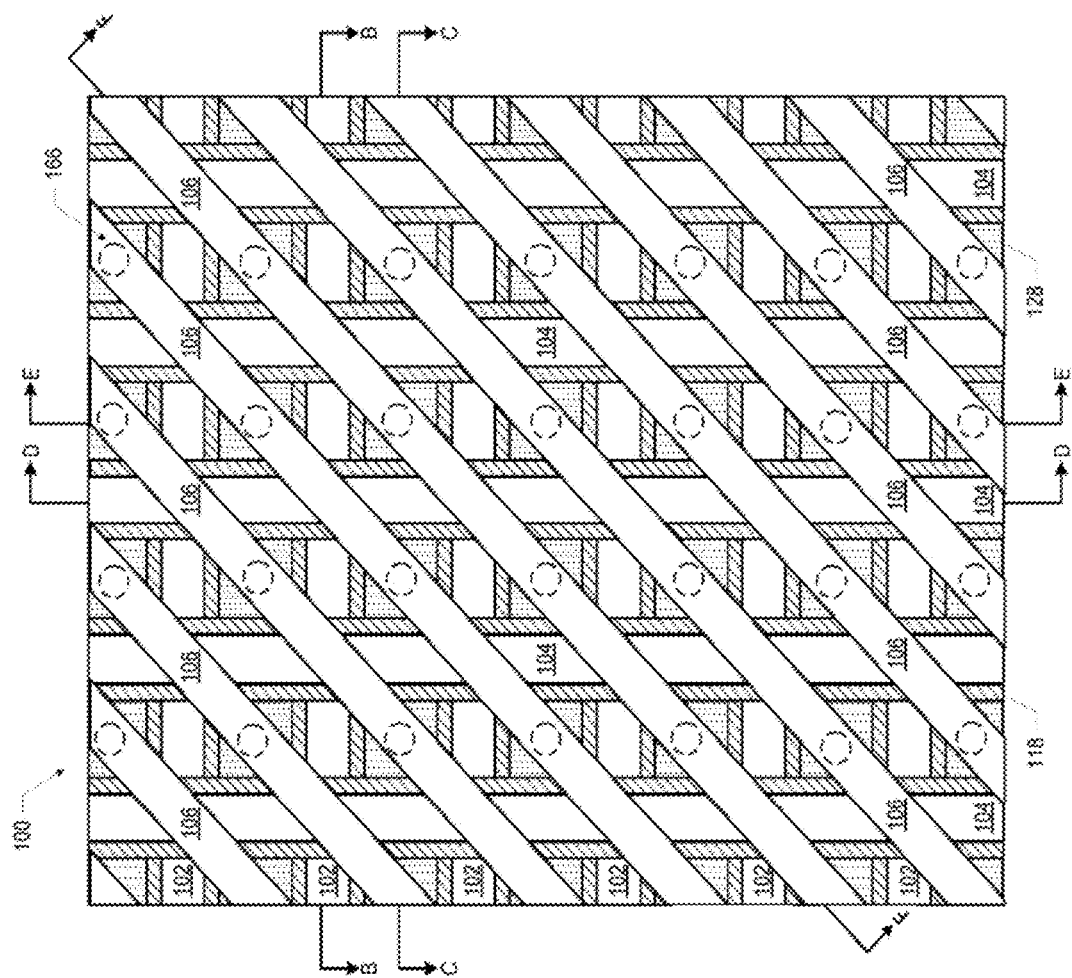
FIGS. 1A-1F illustrate various views of an example quantum dot device, in accordance with one embodiment.

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Introduction

A quantum computer uses quantum-mechanical phenomena such as superposition and entanglement to perform computations. In contrast to digital computers which store data in one of two definite states (0 or 1), quantum computation uses quantum bits (qbits), which can be in superpositions of states. Qbits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin."

Qbit states are typically represented by the bracket notations $|0>$ and $|1>$. In a traditional computer system, a bit is exclusively in one state or the other, i.e., a '0' or a '1.' However, qbits in quantum mechanical systems can be in a superposition of both states at the same time, a trait that is unique and fundamental to quantum computing.

Quantum computing systems execute algorithms containing quantum logic operations performed on qubits. The sequence of operations is statically compiled into a schedule and the qubits are addressed using an indexing scheme. This algorithm is then executed a sufficiently large number of times until the confidence interval of the computed answer is above a threshold (e.g., ~95+%). Hitting the threshold means that the desired algorithmic result has been reached.

Qbits have been implemented using a variety of different technologies which are capable of manipulating and reading quantum states. These include, but are not limited to quantum dot devices (spin based and spatial based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer including, but not limited to, those listed above. The particular physical implementation used for qbits is orthogonal to the embodiments of the invention described herein.

Quantum Dot Devices

Quantum dots are small semiconductor particles, typically a few nanometers in size. Because of this small size, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figure 1B:
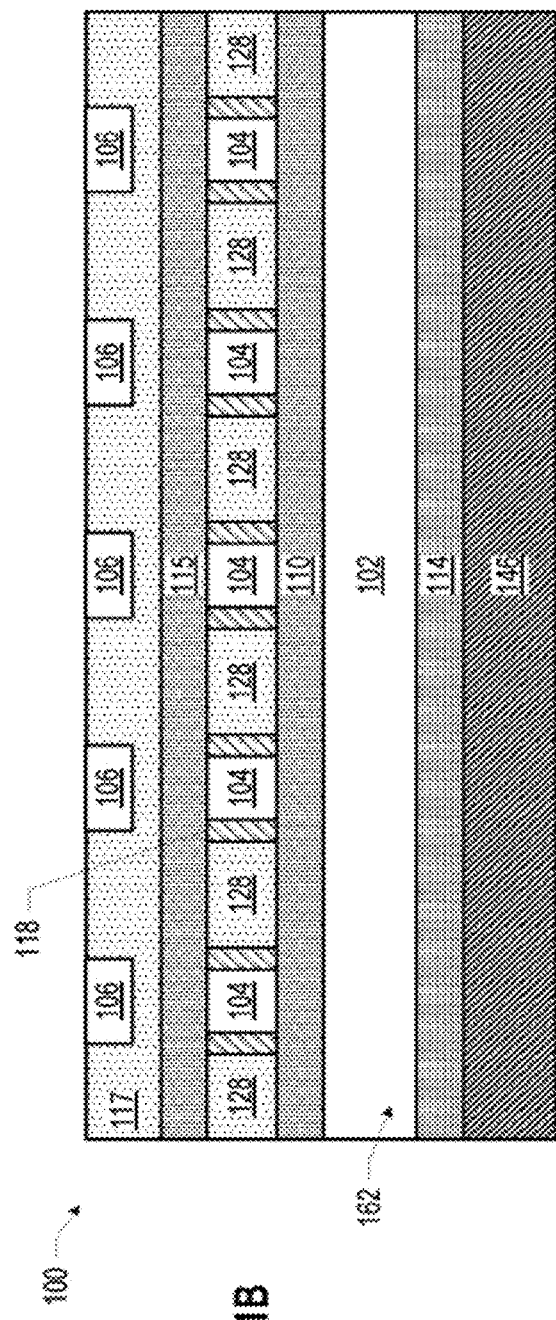
Figure 1C:
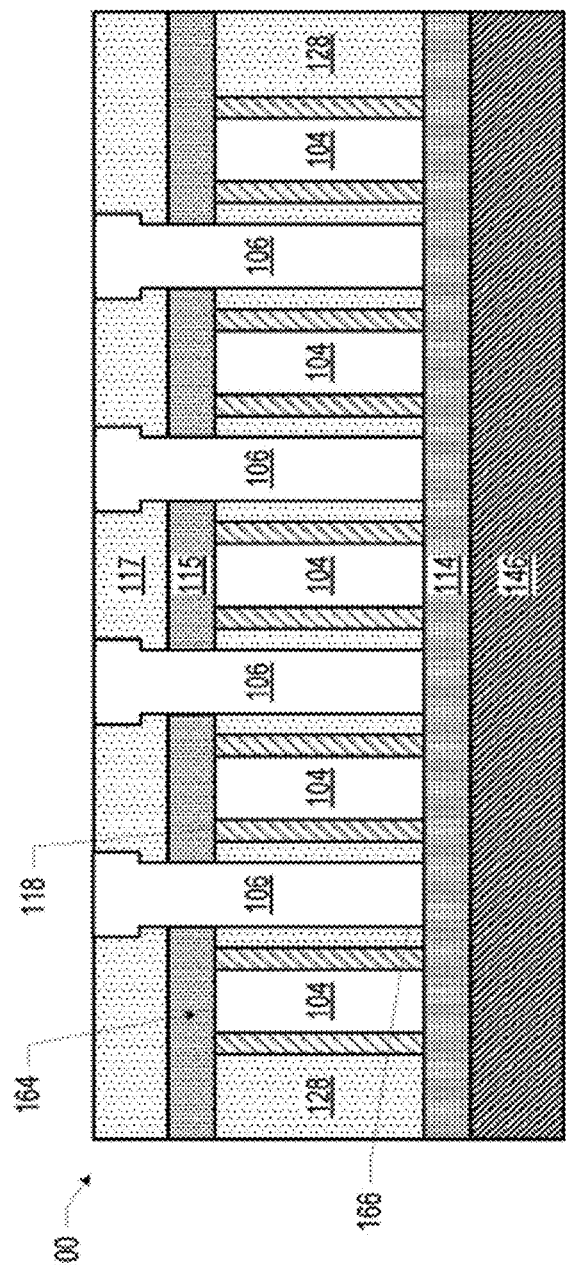
Figure 1D:
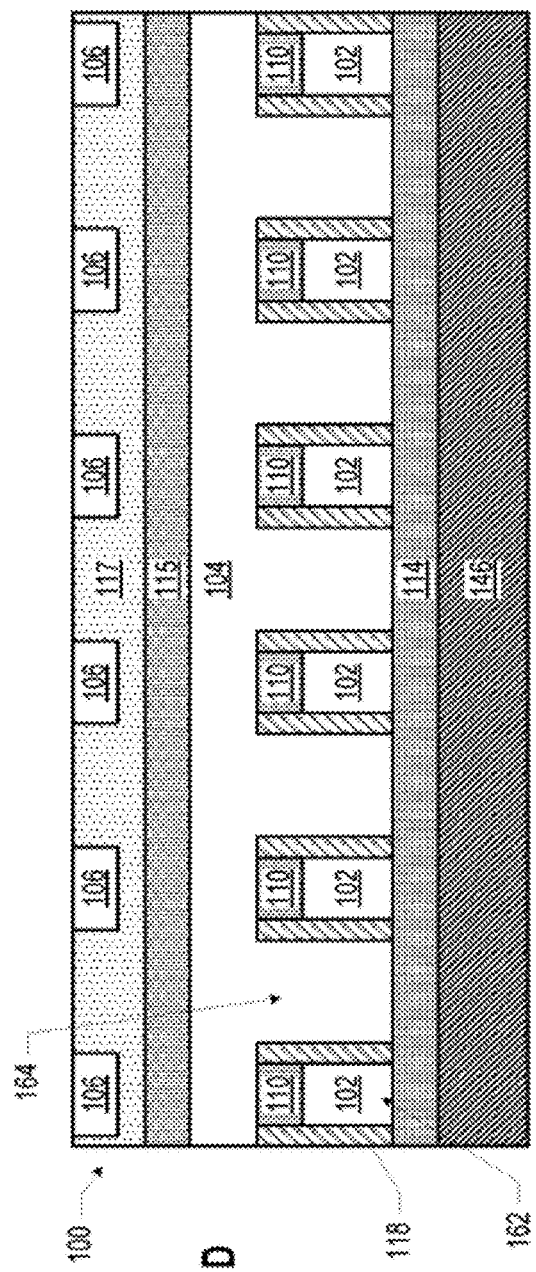
Figure 1E:
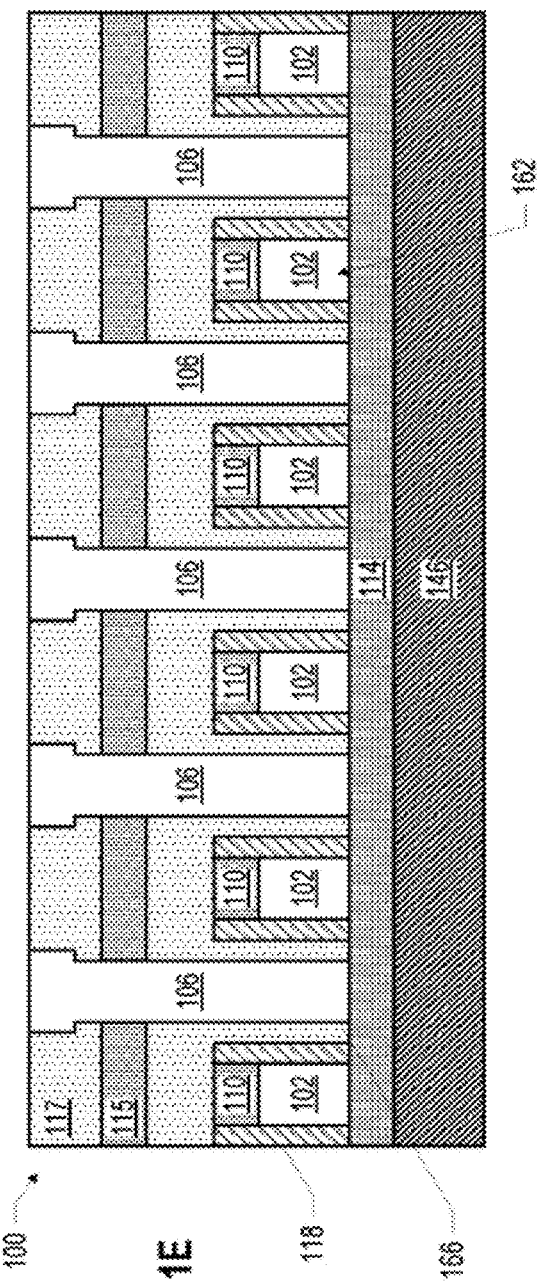
Figure 1F:
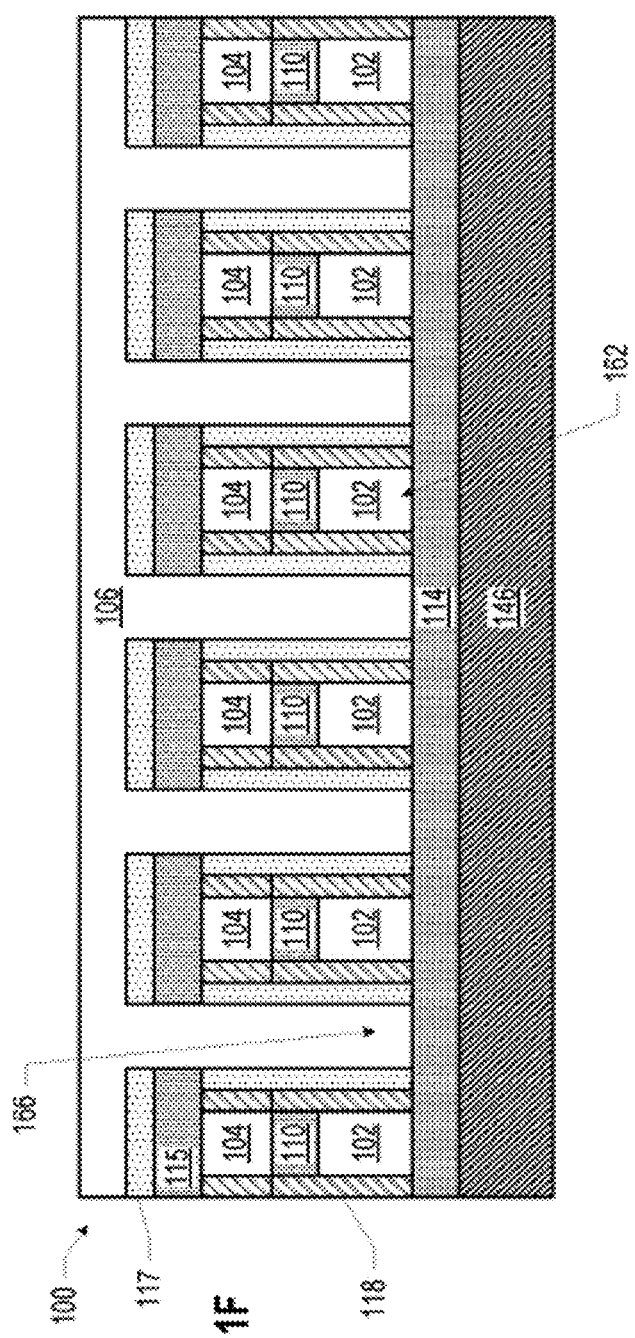

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines, as discussed below. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer 152 (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Apparatus and Method for a Hybrid Classical Quantum Computer

After Richard Feynman asked in 1982 whether quantum physics could be simulated efficiently using a quantum computer, much effort researching for a quantum computer has been focused on its universality and its efficiency over classical computation. One such example is David Deutsch's quantum Turing machine in 1985 that can be programmed to perform any computational task that can be performed by any physical object.

In contrast to theories and algorithms, quantum physical machines are in still their infancy. Efforts to build quantum information processing systems have resulted in modest success to date. Small quantum computers, capable of performing a small set of quantum operations on a very few qubits, represent the state of the art in quantum computation. In addition, quantum states are fragile in the sense that quantum states only remain coherent for a limited duration. This gap between algorithms and physical machines has driven the effort to invent hybrid classical-quantum algorithms. Some recent quantum algorithm developments have focused on short-depth quantum circuits to carry out quantum computations formed as subroutines embedded in a larger classical optimization loop, such as the variational eigensolver (P. J. J. O'Malley, 2016). Quantum languages, tools, and flows have been developed, providing software layers/stacks to translate and optimize applications to the quantum physical layer to cope with the stringent resource constraints in quantum computing (Frederic T. Chong, 2017, 14 Sep.).

On the hardware side, classical computers have been used to perform error correction for quantum computations. The "quantum co-processor" model is the most favorable prevailing execution model where a classical CPU controls a quantum processing unit in a similar manner to how CPUs in modern computer systems interact with GPUs. As described in (X.Fu, 2016, May) and (X. Fu, 2018), the microarchitecture for experimental superconducting quantum co-processors included features such as an arbiter on the code fetch data path to steer classical instruction to host CPU and quantum instruction to quantum co-processor, an exchange register file to synchronize register files between host CPU and the quantum co-processor, and a quantum instruction cache.

The microarchitectures for these mechanisms, however, are not well defined and explicit support for hybrid classical-quantum programs is lacking. Consequently, it is unclear how a quantum co-processor would be implemented within a quantum computer, particularly one which is required to run a diverse set of quantum programs. A flexible and programmable model has yet to be developed for executing hybrid classical-quantum algorithms.

One embodiment of the invention adds a set of quantum instructions to an instruction set architecture (ISA) of a processor such as a CPU. By way of example, these instructions may be included in an extension to the ISA (e.g., such as the AVX-512 extensions for the x86 platform). In addition, in one embodiment, a quantum engine is added to the processor's execution unit and the new quantum instructions are fetched, decoded, scheduled, and executed on the functional units of the quantum engine. In one embodiment, the quantum engine interacts with the classical execution engines using a shared register file and/or system memory. Upon executing the quantum instructions (or quantum cops in certain embodiments described herein), the quantum execution engine generates control signals to manipulate the state of the qubits within the quantum processor. The quantum engine also executes instructions to take a measurement of specified sets of qubits and store the results. In these embodiments, a quantum/classical interface provides connectivity between the quantum engine of the classical processor and the quantum processor.

Figure 2:
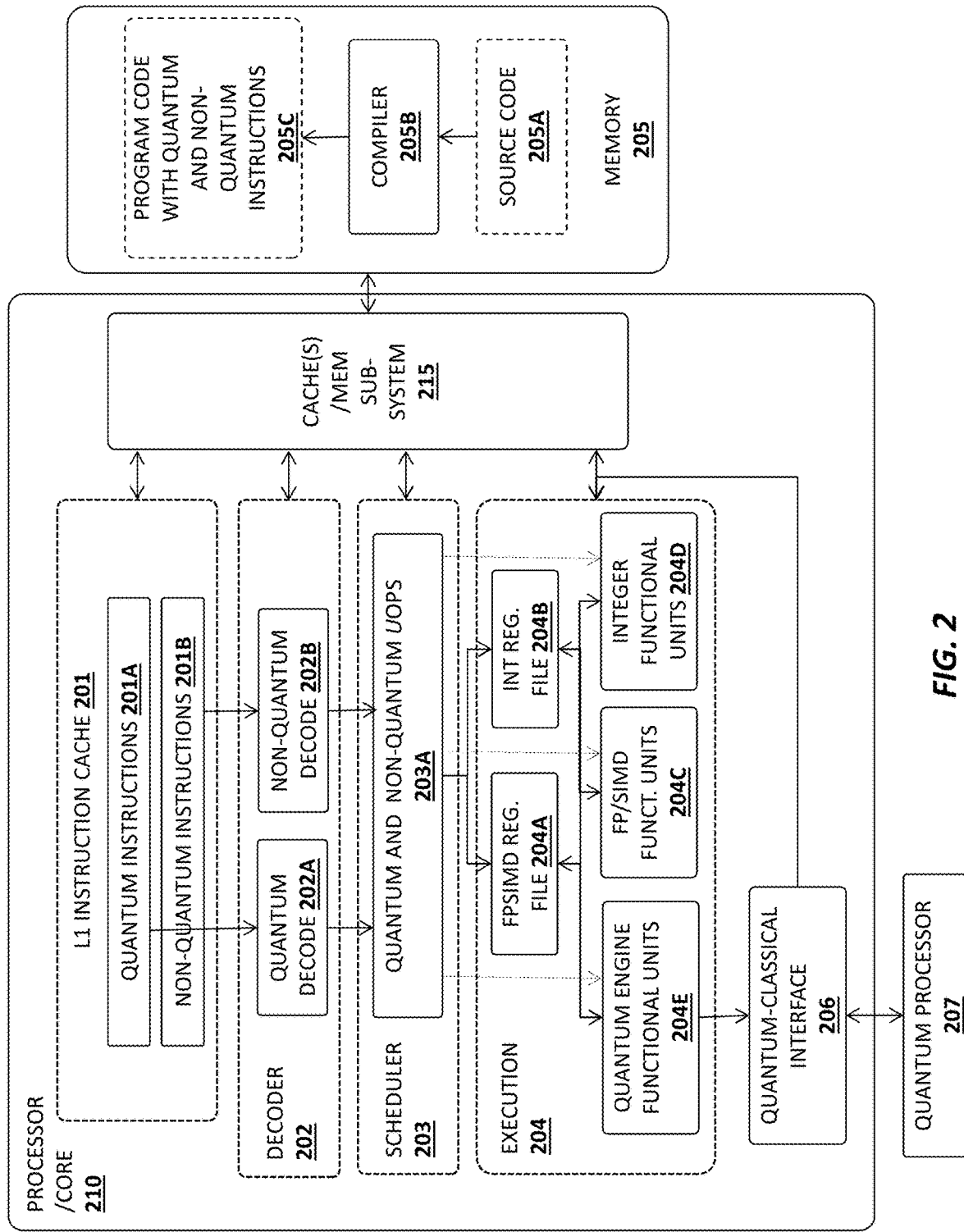
FIG. 2 illustrates one embodiment of a processor pipeline for processing quantum and non-quantum instructions.

FIG. 2 illustrates one embodiment of a processor or core 210 which fetches, decodes, and executes quantum instructions 201A and non-quantum instructions 201B, utilizing the same pipeline resources as the non-quantum instructions 201B. The processor/core 210 of this embodiment supports quantum extensions to an existing ISA of the processor/core 210 (e.g., extending the ISA to include the quantum instructions 201A). Program code 205C comprising the quantum and non-quantum instructions is generated by a compiler 205B from source code 205A written by a programmer (e.g., utilizing the extended ISA). Various source/program code examples are provided below.

Quantum and non-quantum instructions 201A-B are fetched from memory 205 at the front end of the instruction pipeline and stored in a Level 1 (L1) instruction cache 201. Instructions and data may also be stored within a Level 2 or Level 3 cache within a cache/memory subsystem 215, which manages memory requests and cache coherency.

A decoder 202 decodes the instructions 201A-B into micro-operations or uops 203A which are scheduled for execution by a scheduler 203 and executed by execution circuitry 204. In one embodiment, certain stages of the pipeline are enhanced to include hardware support for processing the quantum instructions 201B while other stages are unaltered. For example, quantum decode circuitry 202A may be added to the decoder 202 for decoding the quantum instructions 201A, just as non-quantum decode circuitry 202B decodes non-quantum instructions 201B. Although illustrated as separate components in FIG. 2 for the purpose of explanation, the quantum decode circuitry 202A and non-quantum decode circuitry 202B may comprise a common or overlapping set of circuitry and/or microcode. For example, in one embodiment, an existing decoder may be extended to include microcode support for quantum instructions (e.g., in microcode ROM) to generate new sets of quantum uops. The decoder 202 includes other decode circuitry such as a set of decode table structures (see, e.g., FIG. 3 and associated text), depending on the processor architecture.

In one embodiment, the decoder 202 generates a sequence of uops 203A in response to decoding the instructions 201A-B. In an implementation with quantum and non-quantum instructions, the uops may include a mixture of quantum uops and non-quantum uops, which are then scheduled for execution by an instruction scheduler 203.

The quantum and non-quantum uops 203A generated by the decoder 202 may initially be queued for execution within one or more uop queues of the scheduler 203, which dispatches the uops from the uop queue(s) in accordance with dependencies and/or execution resource availability. The embodiments of the invention may be implemented on various different types of processors with different types of schedulers. For example, in one embodiment, a set of execution "ports" couple the scheduler 203 to the execution circuitry 204, where each execution port is capable of issuing uops to a particular set of functional units 204C-E. In the example architecture shown in FIG. 2, for example, SIMD and floating point (FP) uops may be issued by the scheduler 203 over a FP/SIMD execution port coupled to a set of FP/SIMD functional units 204C and integer uops may be issued over an integer port coupled to a set of integer functional units 204D. While only two types of non-quantum functional units are shown for simplicity, the processor/core 210 may include various other/additional non-quantum functional units (e.g., such as load/store address generation units, branch units, additional SIMD and integer units, etc).

In the particular embodiment shown in FIG. 2, the quantum engine functional units 204E share the same set of register files 204A-B used by the legacy processor functional units 204C-D. In this particular example, the register files 204A-B include a FP/SIMD register file 204A which stores floating point and SIMD operands used by the FP/SIMD functional units 204C and an integer register file 204B which stores integer operands for the integer functional units 204D. In one implementation, the FP/SIMD register file 204A comprises 512 bit vector registers and the integer register file 204B comprises 64-bit scalar registers. Of course, different processor architectures will use different types of registers shared by the quantum engine functional units 204E. Various other types of registers may also be used such as a set of control/status registers and mask registers.

In an embodiment in which quantum uops are mixed with non-quantum uops, the quantum uops are issued over one or more quantum ports to a set of quantum engine functional units 204E, which execute the quantum uops to perform the underlying quantum operations. For example, the quantum engine functional units 204E, in response to the quantum uops, may generate control signals over a quantum-classical interface 206 to manipulate and take measurements of the qubits of a quantum processor 207.

The quantum-classical interface 206 includes digital-to-analog (D-A) circuitry to convert the digital quantum control signals generated by the quantum engine functional units 204E to analog signals required to control the quantum processor 207 (e.g., such as the codeword triggered pulse generation (CTPG) units and Arbitrary Waveform Generator (AWG) described below) and also includes analog-to-digital (A-D) circuitry to convert the physical qubit measurements to digital result data.

In one embodiment, the quantum-classical interface 206 is integrated on the same semiconductor chip as the other components of the instruction processing pipeline (e.g., the execution circuitry 204, scheduler 203, decoder 202, etc). As discussed in detail below, different types of circuit/logic components may be used depending on the particular physical implementation of the quantum processor 207.

Figure 3:
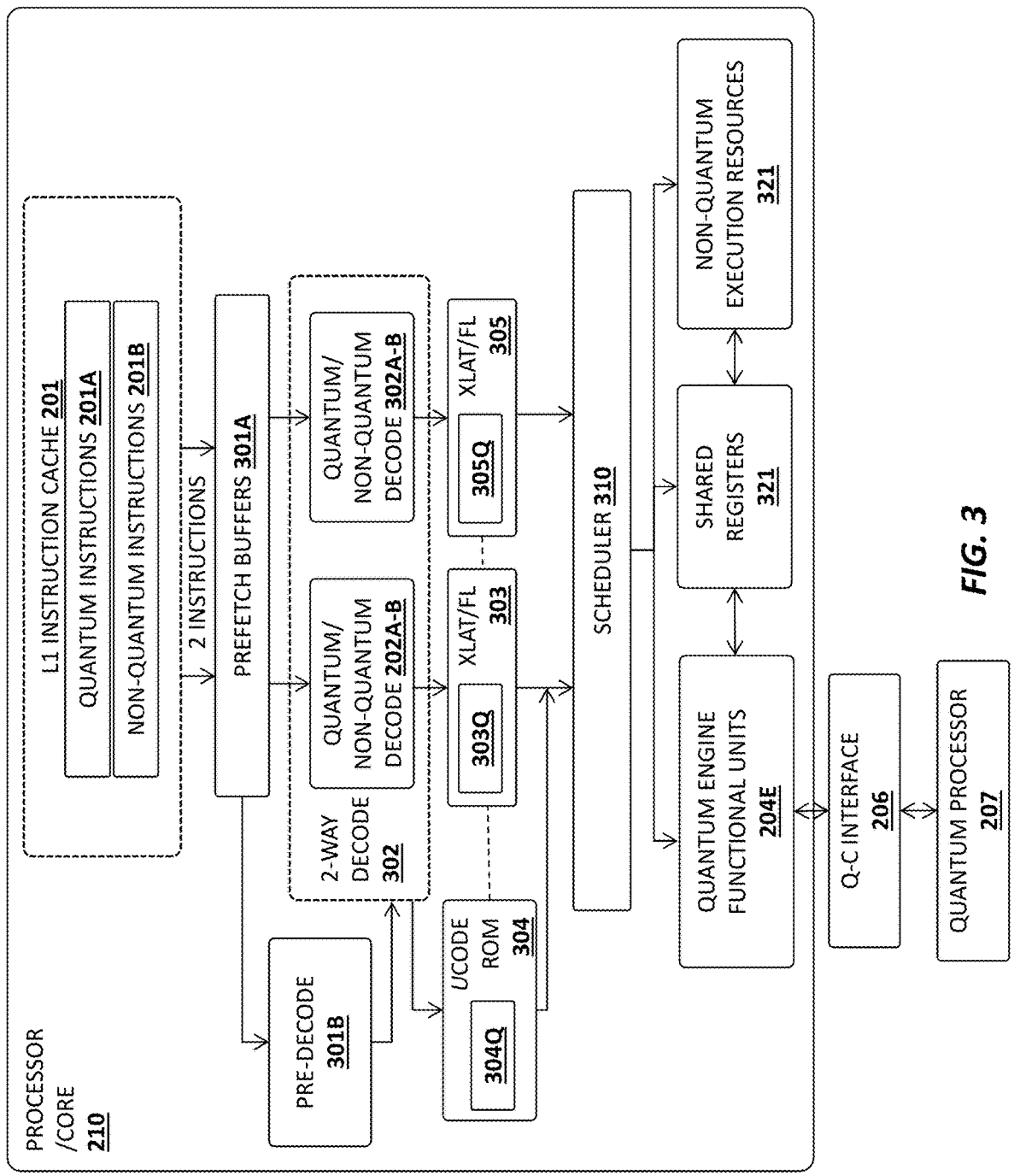
FIG. 3 illustrates an embodiment of front-end circuitry of a processor for processing quantum and non-quantum instructions.

FIG. 3 illustrates one embodiment in which quantum instruction processing support is added to a low power processing pipeline including a pre-decode buffer 301B, a 2-way decoder 302 with dual sets of quantum/non-quantum decoder circuitry 202A-B, 302A-B, dual lookup tables for instruction translation (XLAT), and a ucode ROM 304. In one embodiment, the XLAT components 303, 305 and ucode ROM 304 are extended to support the quantum instructions, as indicated by logic blocks 303Q-305Q. The pre-decode buffer 301B detects and marks macro-instruction boundaries prior to full decoding into uops by the 2-way decoder 302.

The operands for the quantum and non-quantum uops are stored in a set of shared registers 321 (as described above) and accessed by the quantum functional units 320 when executing the uops. The Q-C interface 320, in response to the quantum uops, controls the operation of the quantum processor 207.

Figure 4A:
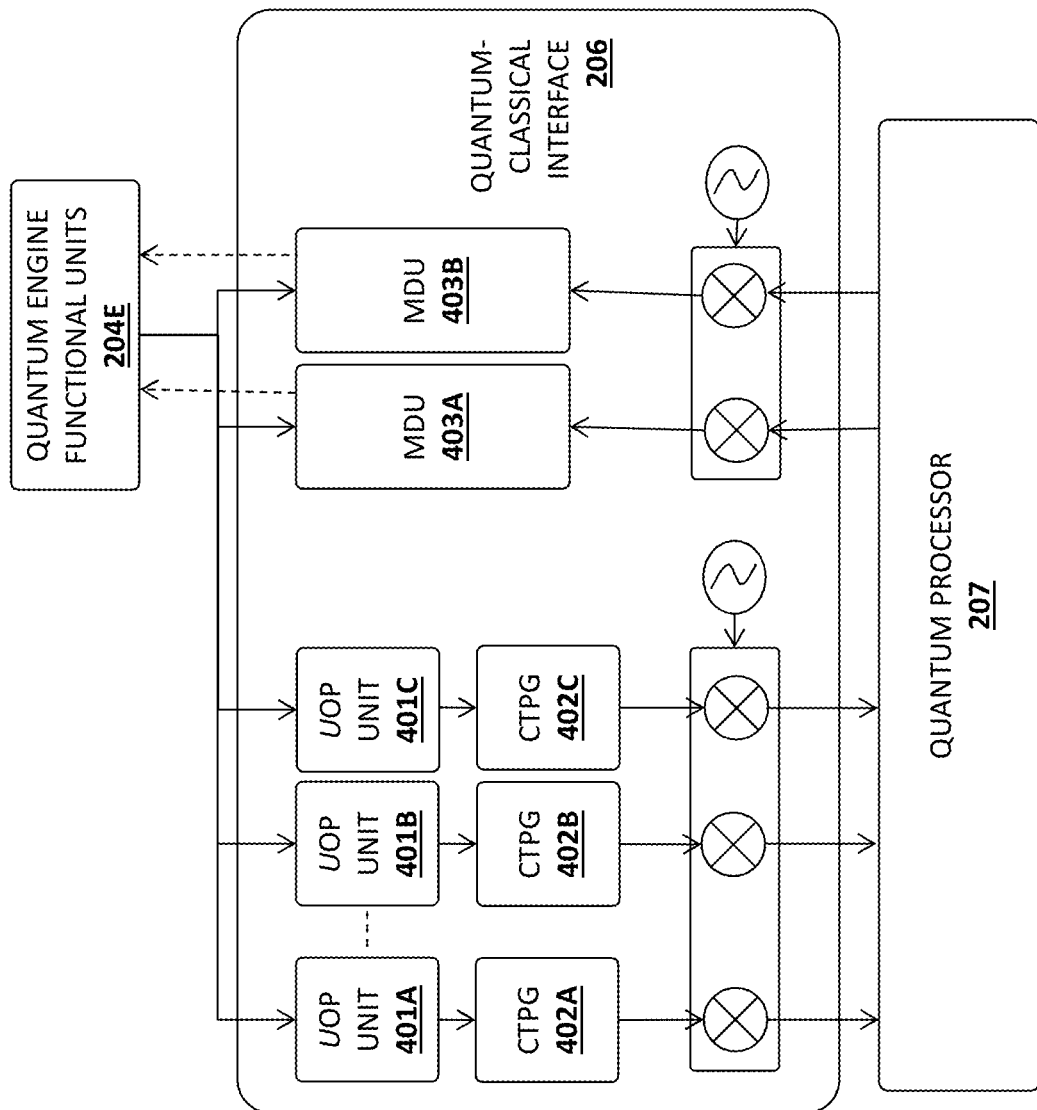
FIGS. 4A-B illustrate embodiments of a quantum-classical processor interface.
Figure 4B:
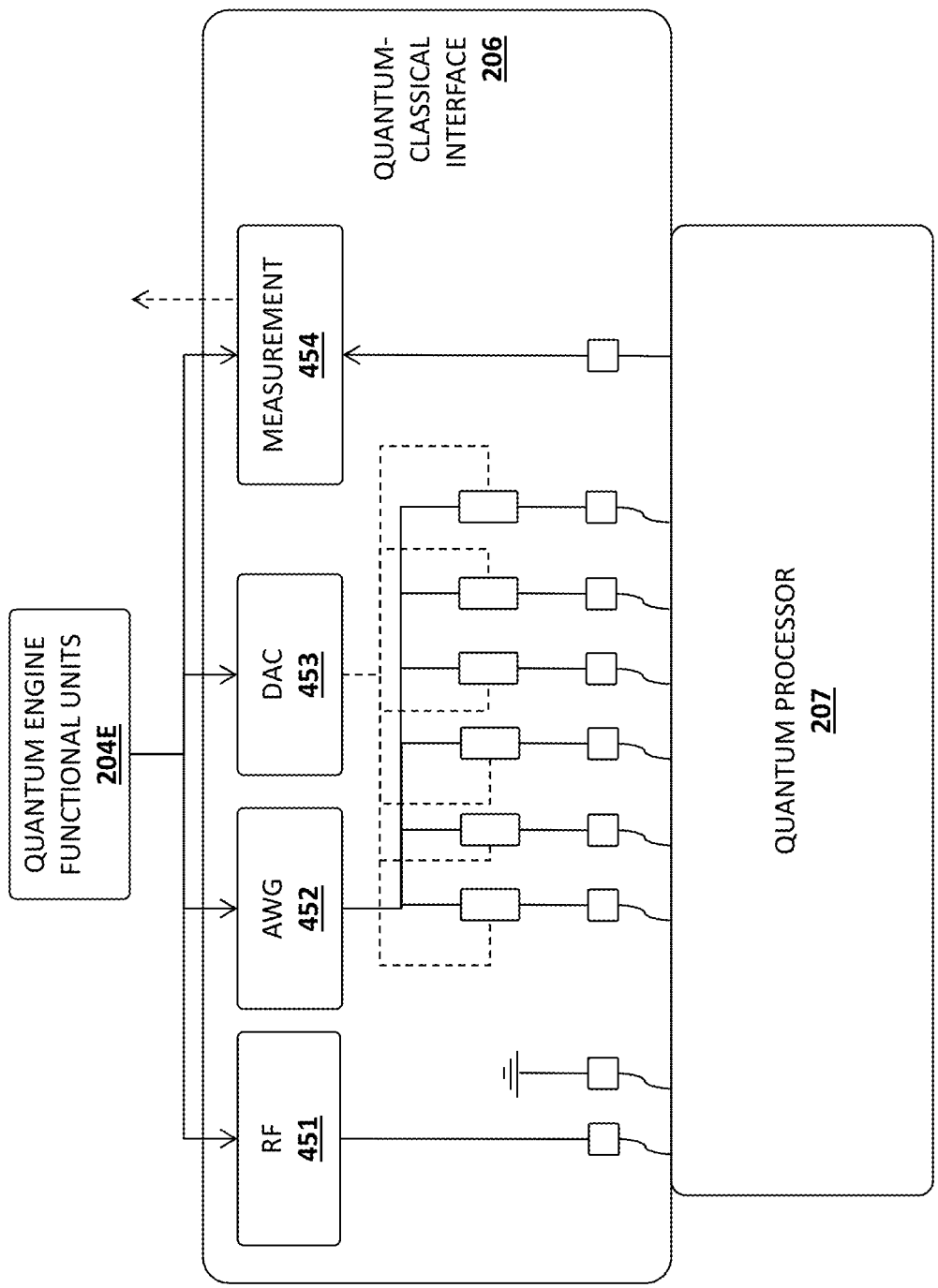

Different examples of a quantum-classical interface 206 are illustrated in FIGS. 4A-B. The Q-C interface 206 in FIG. 4A includes a plurality of uop units 401A-C which, responsive to the uops executed by the quantum engine functional units 204E, generate codewords to control operation of a plurality of codeword triggered pulse generation (CTPG) units 402A-C. In response, the CTPG units 402A-C generate sequences of pulses to control the qubits of the quantum processor 207. Once the quantum processor 207 has reached a specified execution state, quantum measurements are taken by one or more of the measurement discrimination units (MDUs) 403A-B.

The Q-C interface 206 shown in FIG. 4B includes a set of components to perform microwave complex signal generation including an RF microwave unit 451, a multi-channel Arbitrary Waveform Generators (AWG) 452, one or more digital to analog converters (DACs) 453 and one or more measurement units 454. In one embodiment, the input to each of these components comprises a set of codewords generated by the quantum engine functional units 204E and the output is an analog waveform which manipulates the state of the qubits of the quantum processor 207. The measurement units 454 measure a current state associated with one or more qubits at a designated point in execution.

Apparatus and Method for Dynamically Adjusting Quantum Computer Clock Frequency with a Locking Pulse Current quantum computer designs implement a statically defined cycle time for each single qubit operation that the system is capable of executing. Two qubit operations are then realized with cycle counts that are a fixed multiple of the static single operation cycle time. The duration of a single qubit quantum operation is dependent on the specific quantum control operation along with the harmonic response frequency of the qubit. For example, in a typical solid state qubit realization, the qubit response frequency may be around 6.3 GHz and a common state rotation requires a control microwave pulse that is matched to this frequency. A basic operation such as a so-called pi pulse on a 6.3 GHz qubit would take about 30 nanoseconds to complete. Therefore, in current designs, 30 nanoseconds may be selected as the fixed cycle time.

There are advantages to such a scheme because it makes the electronics much simpler if fixed intervals are assumed for single qubit operations and some multiple of these fixed intervals for operations involving multiple qubits. However, there are some distinct disadvantages to this approach that must be considered when building a quantum computing platform capable of both sustainable availability of computation and the ability to execute much longer circuits and more accurately.

The first issue has to do with the fact that qubits themselves are not uniform in their response frequencies. Due to variations in the materials stack comprising solid state qubits, there may be a mix of frequencies that the qubits respond to. Some will be faster, say 20 ns for a qubit that responds at 8.0 GHz, and some will be quite slow, say 40 ns when the response frequency is below 6.3 GHz. Additionally, it is desirable to have qubits engineered so that they have different resonance harmonic frequencies. The reason for this is that an attempt is made to rotate an 8.0 GHz qubit when it is sitting next to another qubit that responds at 8.0 GHz then an error may be produced when both qubits are accidentally rotated instead of the one that was intended.

The second issue has to do with the gradual drift of the qubits away from their resonant frequencies due to environmental interactions that cause these frequencies to degrade over time and cause control errors. Therefore, it is important when executing a quantum algorithm to ensure that the cycle time can be reduced for qubits that have become particularly sensitive to drift in the resonance frequencies. This will extend the length of time that the qubits can be used for computation before the penalty is incurred for recalibrating the quantum system back into a more favorable regime. This is not possible if the cycle time is statically assigned for the quantum computer and leads to early failure and more frequent recalibrations and hence costs.

Given the wide bandwidth of frequencies necessary to control individual qubits in the quantum processor, the static cycle time approach must select the system wide cycle time for all qubits based on the qubit with the slowest control interval. This can result in the faster qubits spending a lot of time at idle when they could be used for quantum operations.

To address these limitations, one embodiment of the invention dynamically adjusts the cycle time based on knowledge of the actual quantum mechanical behavior of each qubit in the system. Adjustments to cycle time are determined based on the actual performance and error rates for each qubit, which are measured over a period of time. The quantum execution unit is configured to efficiently schedule quantum operations given these error rates and operational speeds for each qubit in the computer.

Figure 5:
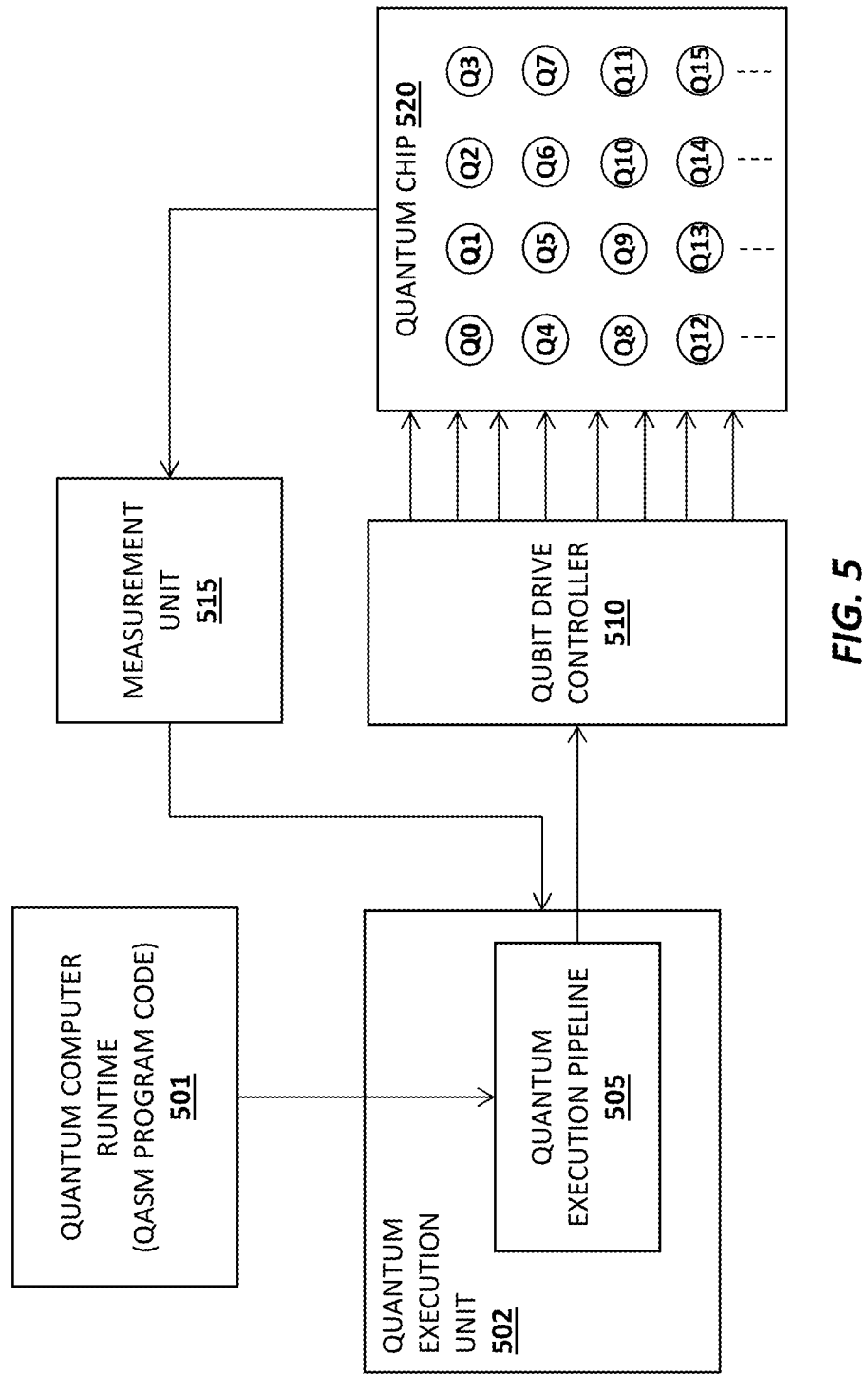
FIG. 5 illustrates an example of a quantum computing system.

For the purpose of comparison, FIG. 5 illustrates a typical quantum computer execution flow. The illustrated example includes a quantum computer runtime 501 (e.g., implemented in QASM program code), which is executed by a quantum execution pipeline 505 of a quantum execution unit 502. In response to execution of the quantum program code, the quantum execution pipeline 505 transmits commands to a qubit drive controller 510 which performs the physical quantum operations on the quantum chip 520. After all program operations have completed, a measurement unit 515 estimates the quantum state of a qubit or set of qubits and returns the measurement results back to the quantum execution unit 502 for further processing in accordance with the quantum runtime 501. As mentioned, the typical operational flow of current quantum computer designs based on a fixed cycle time for each quantum operation executed by the quantum execution pipeline 505 and each measurement taken by the measurement unit 515.

Figure 6:
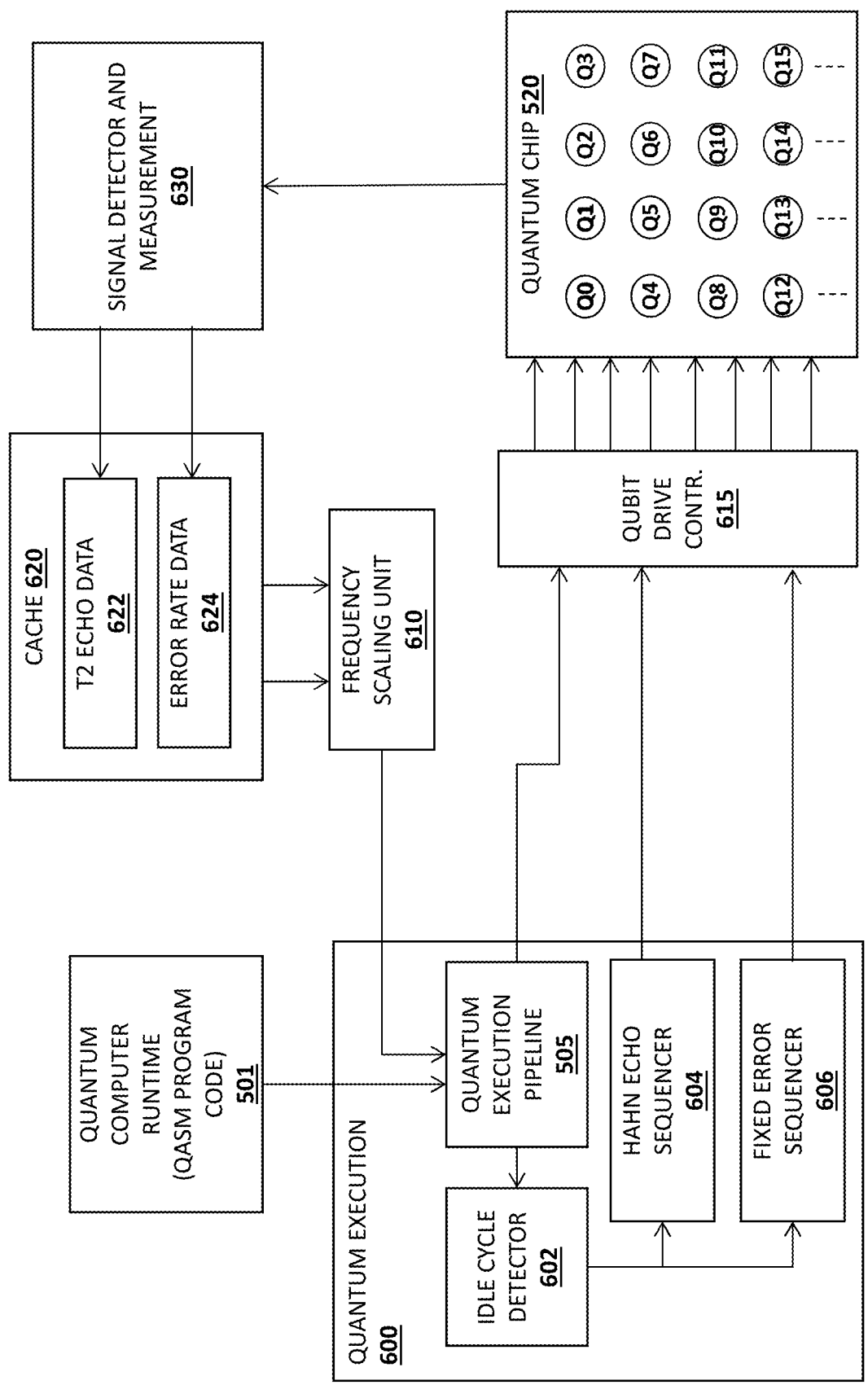
FIG. 6 illustrates one embodiment of the invention which includes a Hahn Echo sequencer and fixed error sequencer.

In order to add the ability to dynamically adjust the cycle time for the quantum operations, the best cycle time is determined by utilizing feedback from the qubit drive controller and the qubit chip working together. FIG. 6 illustrates one embodiment of the invention which performs dynamic frequency scaling. As in FIG. 5, this embodiment includes a quantum chip 520, a signal detector and measurement unit 630, a quantum execution pipeline 505, and a quantum computer runtime 501.

An idle cycle detector 602 detects when no algorithm is currently executing on the system and responsively controls a Hahn Echo sequencer 604 which controls the qubit drive controller 615 to implement a Hahn Echo sequence (sometimes referred to as a "spin echo" sequence). In this embodiment, the Hahn Echo sequence causes the refocusing of spin magnetization of one or more qubits on the quantum chip 520 by one or more pulses of resonant electromagnetic radiation generated by the qubit drive controller 615.

In one embodiment, the idle cycle detector 602 comprises a fixed Voltage Controlled Oscillator (VCO) to run the dynamic frequency techniques described herein at a specified interval when initially tuning the system. In another embodiment, however, the idle cycle detector 602 searches for free cycles between executions of the quantum program 501 to attempt dynamic frequency adjustment.

In addition, in one embodiment, a fixed error sequencer 606 (also under the control of the idle cycle detector 602) attempts to compensate for errors detected during execution. For example, as described below, the fixed error sequencer 606 may issue sequences of error discrimination commands that fit within a specified time interval for each qubit (e.g., the T2* time in some of the below embodiments).

A cache 620 or other type of local memory unit includes T2 echo data 622 comprising results of the Hahn Echo sequencer 604 and error rate data 624 associated with the Fixed Error sequencer 606. While a local data cache 620 is used in this embodiment, various other storage structures may be used including, for example, a set of registers or a local addressable memory device.

In one embodiment a frequency scaling unit (FSU) 610 reads both the T2 echo data 622 and error rate data 624 and determines how to adjust the cycle time for quantum operations (e.g., either up or down). In one embodiment, a machine learning architecture such as a deep neural network (DNN) or generative adversarial network (GAN) is used to determine an optimal frequency for the next program execution on the machine.

Figure 7:
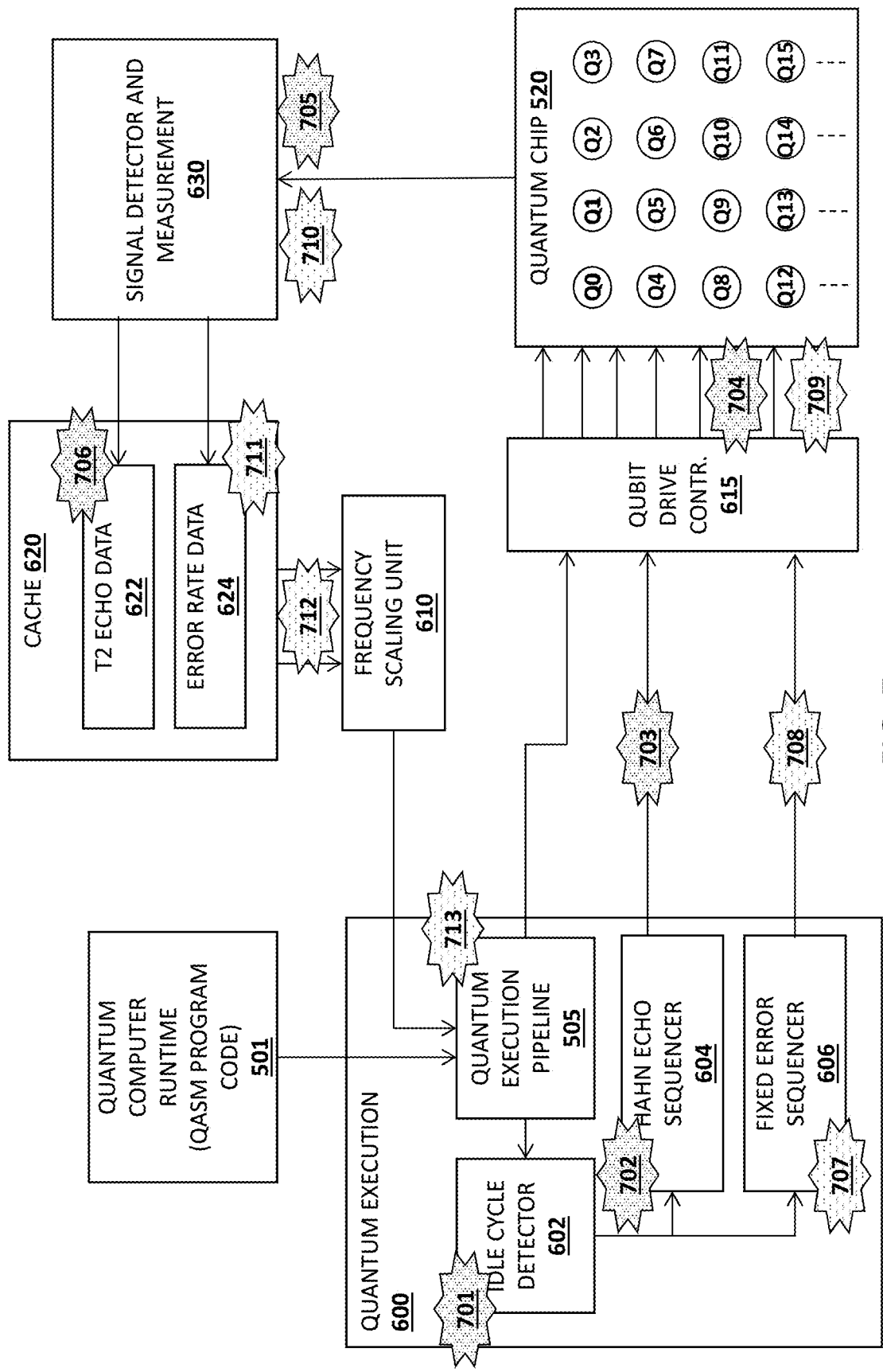
FIG. 7 illustrates a particular set of operations performed on the quantum computing architecture.
Figure 8:
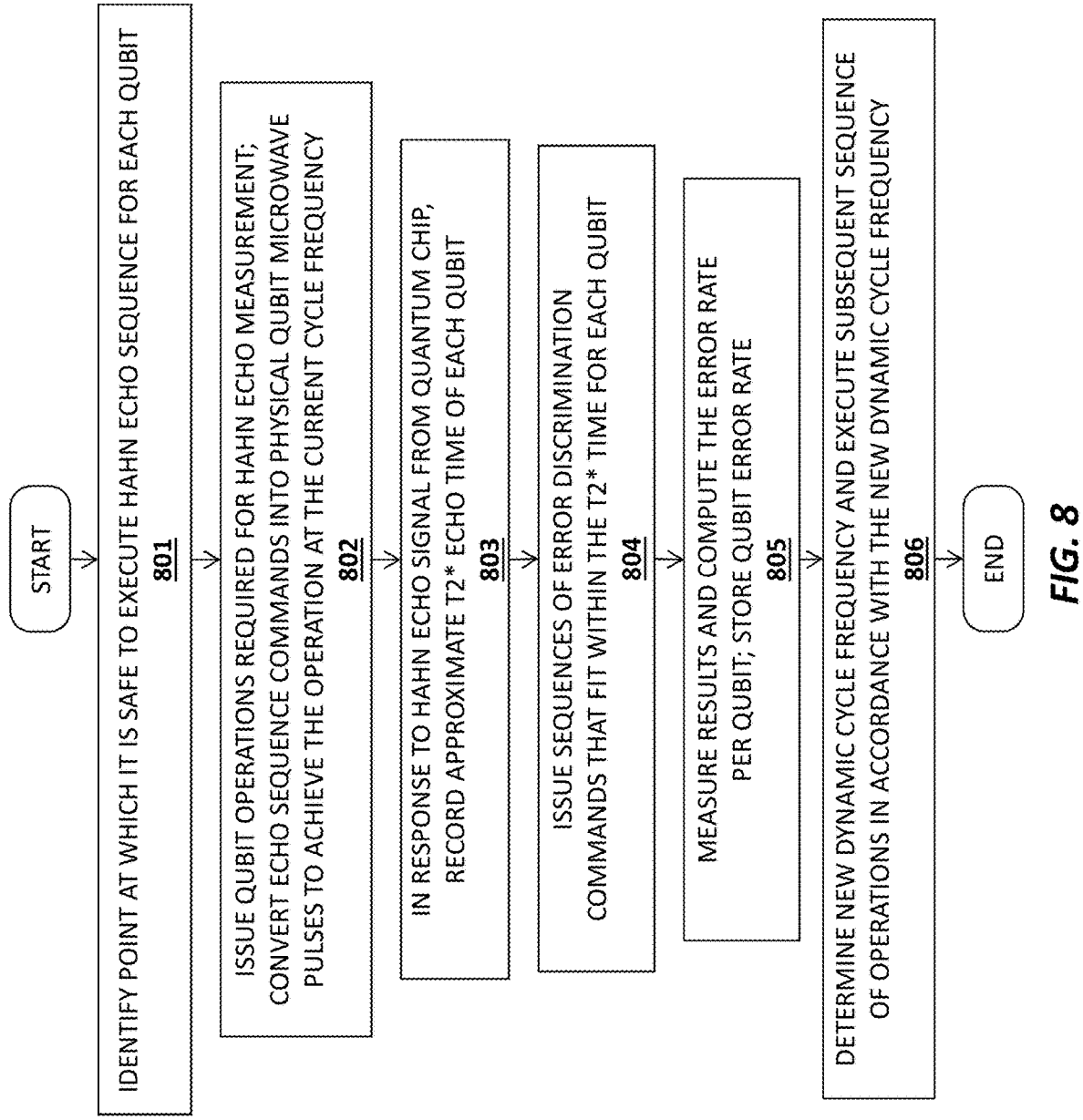
FIG. 8 illustrates a method in accordance with one embodiment of the invention.

FIG. 7 illustrates one embodiment of a sequence of operations performed on this architecture to implement a dynamic Hahn Echo locking pulse. The shaded stars labeled 701-706 identify the Hahn Echo sequencer path.

At 701, the idle cycle detector 602 determines that it is safe to execute the Hahn Echo sequence for each qubit (e.g., Q0-Q15 on the quantum chip 520) and commands the Hahn Echo sequencer 604 to proceed. It may then stall the quantum execution pipeline 505 for the duration of both the Hahn Echo sequence generated by the Hahn Echo sequencer 604 and the fixed error sequence generated by the fixed error sequencer 606.

At 702, the Hahn Echo sequencer 604 begins issuing the qubit operations required for a Hahn Echo measurement process. At 703, the qubit drive controller 615 converts the echo sequence instructions/commands to physical qubit microwave pulses necessary to achieve the operation at the current cycle frequency.

At 704 the quantum chip 520 receives the I/Q (in-phase/quadrature) pulses from the quantum drive controller 615 and evolves accordingly. At 705 the signal detector and measurement unit 630 waits for the Hahn Echo signal from the quantum chip 520 and records the approximate T2 echo time 622 of the qubit (storing in the local cache 620). This T2 time is sometimes referred to as the T2* time and determines the coherence time or amount of computational time available for that qubit to perform quantum operations. The T2* time provides an indication of how many quantum operations can be performed on that qubit given a particular control pulse duration at the current operational resonance frequency of the qubit. At 706, the T2* time 622 is recorded into the cache 620 which keeps track of the newly-measured value.

The error discrimination path will now be described with respect to the stars labeled 707-713. It is necessary to not only understand the amount of time allocated for execution of quantum operations on each quantum bit but also the rate of errors that the qubit accumulates during its control operation. Different algorithms may be used to accomplish this such as randomized benchmarking which looks at rotations of the qubit state for fixed angles and then computes how much they deviate from the expected value.

At 707, when the Hahn Echo sequencer 604 has completed performing its operations, the fixed error sequencer 606 utilizes the stored T2* time for each qubit (as indicated in the T2 echo data 622) to issue sequences of error discrimination commands that fit within the T2* time for each qubit. These commands are dispatched at 708 and are converted by the qubit drive controller 615 to physical qubit microwave pulses that realize the requested qubit operations at 709. The quantum chip 520 receives the I/Q pulses from the qubit drive controller 615 and evolves accordingly.

At 710 the signal detector and measurement unit 630 computes the error rate from the fixed error sequencer algorithm which is run per qubit. At 711, the error rate is stored in the error rate data 624 for later use by the frequency scaling unit 610. At 712, the frequency scaling unit 610 now has sufficient data to determine what a new dynamic cycle frequency should be and reports it to the quantum execution unit 600. At 713, the quantum execution pipeline 505 utilizes the new dynamic cycle frequency to execute the next sequence of operations (e.g., to perform the next run of the algorithm).

At 801, a determination is made that it is safe to execute the Hahn Echo sequence for each qubit (e.g., Q0-Q15). The quantum execution pipeline may be stalled for the duration of both the Hahn Echo sequence and the fixed error sequence described herein.

At 802, the qubit operations required for a Hahn Echo measurement process are issued and converted into physical qubit microwave pulses necessary to achieve the operation at the current cycle frequency.

At 803, in response to a Hahn echo signal from the quantum chip, the approximate T2 echo time of each qubit is measured and stored in an on-chip cache or memory. This T2 time is sometimes referred to as the T2* time and determines the coherence time or amount of computational time available for that qubit to perform quantum operations. The T2* time provides an indication of how many quantum operations can be performed on that qubit given a particular control pulse duration at the current operational resonance frequency of the qubit.

At 804, the stored T2* times are used to issue sequences of error discrimination commands that fit within the T2* time for each qubit. At 805 the results are measured and the per-qubit error rate computed. The error rates are then stored locally (e.g., in a local cache). At 806, a new dynamic cycle frequency is determined for a subsequent sequence of operations. For example, the next run of the algorithm may be performed using the new cycle times.

In the above detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

EXAMPLES

The following are example implementations of different embodiments of the invention.

Example 1

An apparatus comprising: a quantum execution unit to execute quantum operations specified by a quantum runtime; a qubit drive controller to translate the quantum operations into physical pulses directed to qubits on a quantum chip at a first cycle frequency; a spin echo sequencer to issue spin echo command sequences to cause the qubit drive controller to generate a spin echo sequence of pulses at the first cycle frequency; and qubit measurement circuitry to measure the qubits and to store qubit timing data for each qubit, the qubit timing data indicating a coherence time or an amount of computational time available for each qubit to perform quantum operations.

Example 2

The apparatus of example 1 wherein the spin echo sequencer comprises execution circuitry to execute a set of spin echo instructions.

Example 3

The apparatus of example 1 wherein the spin echo sequencer comprises fixed function circuitry to cause the qubit drive controller to generate the spin echo sequence of pulses.

Example 4

The apparatus of example 1 further comprising: an error sequencer to read the qubit timing data for each qubit and to issue sequences of error discrimination commands that fit within the amount of computational time available for each qubit.

Example 5

The apparatus of example 4 wherein the sequences of error discrimination commands are to be converted by the qubit drive controller to a sequence of error discrimination pulses.

Example 6

The apparatus of example 5 wherein the qubit measurement circuitry is to measure the qubits following the sequence of error discrimination pulses and to determine and store a per qubit error rate.

Example 7

The apparatus of example 6 further comprising: a frequency scaling unit to determine a new dynamic cycle frequency using the per-qubit error rate.

Example 8

The apparatus of example 7 wherein the quantum execution unit is to execute a subsequent set of quantum operations in accordance with the new dynamic cycle frequency.

Example 9

The apparatus of example 1 further comprising: an idle cycle detector to provide an indication when no operations related to a quantum algorithm are being executed by the quantum execution unit, wherein the spin echo sequencer to is to begin issuing the spin echo command sequences responsive to the indication.

Example 10

A method comprising: executing quantum operations specified by a quantum runtime; translating the quantum operations into physical pulses directed to qubits on a quantum chip at a first cycle frequency; issuing spin echo command sequences of operations to cause a spin echo sequence of pulses to be generated at the first cycle frequency; and measuring the qubits and storing qubit timing data for each qubit, the qubit timing data indicating a coherence time or an amount of computational time available for each qubit to perform quantum operations.

Example 11

The method of example 10 wherein the sequences of operations comprise sequences of executable instructions, the method further comprising: executing the sequences of executable instructions on quantum execution circuitry to cause the spin echo sequence of pulses to be generated.

Example 12

The method of example 10 wherein the sequences of operations comprise digital signaling implemented on fixed function circuitry to cause the spin echo sequence of pulses.

Example 13

The method of example 10 further comprising: issuing sequences of error discrimination commands that fit within the amount of computational time available for each qubit.

Example 14

The method of example 13 wherein the sequences of error discrimination commands are to be converted to a sequence of error discrimination pulses directed at the qubits.

Example 15

The method of example 14 further comprising: measuring the qubits following the sequence of error discrimination pulses; and determining and storing a per-qubit error rate responsive to measuring.

Example 16

The method of example 15 further comprising: determining a new dynamic cycle frequency using the per-qubit error rate.

Example 17

The method of example 16 further comprising: executing a subsequent set of quantum operations in accordance with the new dynamic cycle frequency.

Example 18

The method of example 10 further comprising: providing an indication when no operations related to a quantum algorithm are being executed by the quantum execution unit, initiating the issuing of the spin echo command sequences responsive to the indication.

Example 19

A machine-readable medium having program code stored thereon which, when executed by a machine, causes the machine to perform the operations of: executing quantum operations specified by a quantum runtime; translating the quantum operations into physical pulses directed to qubits on a quantum chip at a first cycle frequency; issuing spin echo command sequences of operations to cause a spin echo sequence of pulses to be generated at the first cycle frequency; and measuring the qubits and storing qubit timing data for each qubit, the qubit timing data indicating a coherence time or an amount of computational time available for each qubit to perform quantum operations.

Example 20

The machine-readable medium of example 19 wherein the sequences of operations comprise sequences of executable instructions, the machine-readable medium further comprising program code to cause the machine to perform the operations of: executing the sequences of executable instructions on quantum execution circuitry to cause the spin echo sequence of pulses to be generated.

Example 21

The machine-readable medium of example 19 wherein the sequences of operations comprise digital signaling implemented on fixed function circuitry to cause the spin echo sequence of pulses.

Example 22

The machine-readable medium of example 19 further comprising program code to cause the machine to perform the operations of: issuing sequences of error discrimination commands that fit within the amount of computational time available for each qubit.

Example 23

The machine-readable medium of example 22 wherein the sequences of error discrimination commands are to be converted to a sequence of error discrimination pulses directed at the qubits.

Example 24

The machine-readable medium of example 23 further comprising program code to cause the machine to perform the operations of: measuring the qubits following the sequence of error discrimination pulses; and determining and storing a per-qubit error rate responsive to measuring.

Example 25

The machine-readable medium of example 24 further comprising program code to cause the machine to perform the operations of: determining a new dynamic cycle frequency using the per-qubit error rate.

Example 26

The machine-readable medium of example 25 further comprising program code to cause the machine to perform the operations of: executing a subsequent set of quantum operations in accordance with the new dynamic cycle frequency.

Example 27

The machine-readable medium of example 19 further comprising program code to cause the machine to perform the operations of: providing an indication when no operations related to a quantum algorithm are being executed by the quantum execution unit, initiating the issuing of the spin echo command sequences responsive to the indication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Terms like "first," "second," "third," etc. do not imply a particular ordering, unless otherwise specified.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hardwired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.).

In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

The invention claimed is:
1. An apparatus comprising:
a quantum execution unit to execute quantum operations specified by a quantum runtime;
a qubit drive controller to translate the quantum operations into physical pulses directed to qubits on a quantum chip at a first cycle frequency;

a spin echo sequencer to issue spin echo command sequences to cause the qubit drive controller to generate a spin echo sequence of pulses at the first cycle frequency; and qubit measurement circuitry to measure the qubits and to store qubit timing data for each qubit, the qubit timing data indicating a coherence time or an amount of computational time available for each qubit to perform quantum operations.

2. The apparatus of claim 1 wherein the spin echo sequencer comprises execution circuitry to execute a set of spin echo instructions.

3. The apparatus of claim 1 wherein the spin echo sequencer comprises fixed function circuitry to cause the qubit drive controller to generate the spin echo sequence of pulses.

4. The apparatus of claim 1 further comprising:
an error sequencer to read the qubit timing data for each qubit and to issue sequences of error discrimination commands that fit within the amount of computational time available for each qubit.

5. The apparatus of claim 4 wherein the sequences of error discrimination commands are to be converted by the qubit drive controller to a sequence of error discrimination pulses.

6. The apparatus of claim 5 wherein the qubit measurement circuitry is to measure the qubits following the sequence of error discrimination pulses and to determine and store a per qubit error rate.

7. The apparatus of claim 6 further comprising:
a frequency scaling unit to determine a new dynamic cycle frequency using the per-qubit error rate.

8. The apparatus of claim 7 wherein the quantum execution unit is to execute a subsequent set of quantum operations in accordance with the new dynamic cycle frequency.

9. The apparatus of claim 1 further comprising:
an idle cycle detector to provide an indication when no operations related to a quantum algorithm are being executed by the quantum execution unit,
wherein the spin echo sequencer to is to begin issuing the spin echo command sequences responsive to the indication.

10. A machine-readable medium having program code stored thereon which, when executed by a machine, causes the machine to perform the operations of:
executing quantum operations specified by a quantum runtime;
translating the quantum operations into physical pulses directed to qubits on a quantum chip at a first cycle frequency;
issuing spin echo command sequences of operations to cause a spin echo sequence of pulses to be generated at the first cycle frequency; and measuring the qubits and storing qubit timing data for each qubit, the qubit timing data indicating a coherence time or an amount of computational time available for each qubit to perform quantum operations.

11. The machine-readable medium of claim 10 wherein the sequences of operations comprise sequences of executable instructions, the machine-readable medium further comprising program code to cause the machine to perform the operations of:
executing the sequences of executable instructions on quantum execution circuitry to cause the spin echo sequence of pulses to be generated.

12. The machine-readable medium of claim 10 wherein the sequences of operations comprise digital signaling implemented on fixed function circuitry to cause the spin echo sequence of pulses.

13. The machine-readable medium of claim 10 further comprising program code to cause the machine to perform the operations of:
issuing sequences of error discrimination commands that fit within the amount of computational time available for each qubit.

14. The machine-readable medium of claim 13 wherein the sequences of error discrimination commands are to be converted to a sequence of error discrimination pulses directed at the qubits.

15. The machine-readable medium of claim 14 further comprising program code to cause the machine to perform the operations of:
measuring the qubits following the sequence of error discrimination pulses; and
determining and storing a per-qubit error rate responsive to measuring.

16. The machine-readable medium of claim 15 further comprising program code to cause the machine to perform the operations of:
determining a new dynamic cycle frequency using the per-qubit error rate.

17. The machine-readable medium of claim 16 further comprising program code to cause the machine to perform the operations of:
executing a subsequent set of quantum operations in accordance with the new dynamic cycle frequency.

18. The machine-readable medium of claim 10 further comprising program code to cause the machine to perform the operations of:
providing an indication when no operations related to a quantum algorithm are being executed by the quantum execution unit,
initiating the issuing of the spin echo command sequences responsive to the indication.

* * * * *